US005618688A

United States Patent [19]
Reuss et al.

[11] Patent Number: 5,618,688
[45] Date of Patent: Apr. 8, 1997

[54] METHOD OF FORMING A MONOLITHIC SEMICONDUCTOR INTEGRATED CIRCUIT HAVING AN N-CHANNEL JFET

[75] Inventors: Robert H. Reuss, Inverness, Ill.; Frederic B. Shapiro, Phoenix, Ariz.

[73] Assignee: Motorola, Inc., Schaumburg, Ill.

[21] Appl. No.: 200,035

[22] Filed: Feb. 22, 1994

[51] Int. Cl.$^6$ .................................................. H01L 21/70
[52] U.S. Cl. ........................... 438/189; 257/370; 257/378; 438/195; 438/207; 438/202
[58] Field of Search ..................... 437/34, 56, 59, 437/31, 162, 192; 257/370, 378

[56] References Cited

U.S. PATENT DOCUMENTS

| | | | |
|---|---|---|---|
| 4,325,180 | 4/1982 | Curran | 29/571 |
| 4,373,253 | 2/1983 | Khadder et al. | 29/576 B |
| 4,403,395 | 9/1983 | Curran | 29/571 |
| 4,902,639 | 2/1990 | Ford . | |
| 4,961,088 | 10/1990 | Gilliland et al. . | |
| 5,134,082 | 7/1992 | Kirchgessner . | |
| 5,248,624 | 9/1993 | Icel et al. . | |
| 5,268,312 | 12/1993 | Reuss et al. . | |
| 5,296,409 | 3/1994 | Merrill et al. | 437/34 |
| 5,407,841 | 4/1995 | Liao et al. | 437/31 |

OTHER PUBLICATIONS

I.F. Chang, "FET–Bipolar Integration," IBM Technical Disclosure Bulletin, vol. 14, No. 1, Jun. 1971, pp. 350–351.
D. de Lang et al., "Integration of Vertical PNP Transistors in a Double–Polysilicon Bi–CMOS Process," IEEE, 1989, pp. 190–193.
D. Stolfa et al., "A BiCMOS 0.8μm Process with a Toolkit for Mixed–Mode Design," Proceedings of the IEEE 1993 Custom Integrated Circuits Conference, May 9–12, 1993.

*Primary Examiner*—George Fourson
*Assistant Examiner*—Long Pham
*Attorney, Agent, or Firm*—Rennie William Dover; William E. Koch

[57] ABSTRACT

An N-channel JFET (60) and a method of forming the N-channel JFET (60) in a BiCMOS process. The N-channel JFET (60) is monolithically fabricated with an N-channel IGFET (70), a P-channel IGFET (75), and an NPN BJT (80) in an epitaxial layer (21). The N-channel JFET (60) is formed in an isolated N-channel JFET region (24), the P-channel IGFET (75) is formed in an isolated P-channel IGFET region (27), and the NPN BJT (80) is formed in an isolated BJT region (29). The N-channel IGFET (70) is fabricated in a P-type well (26) that is not isolated from other N-channel IGFET's in the epitaxial layer (21). Accordingly, the N-channel JFET (60), the N-channel IGFET (70), the P-channel IGFET (75), and an NPN BJT (80) are monolithically formed in the BiCMOS process.

13 Claims, 3 Drawing Sheets

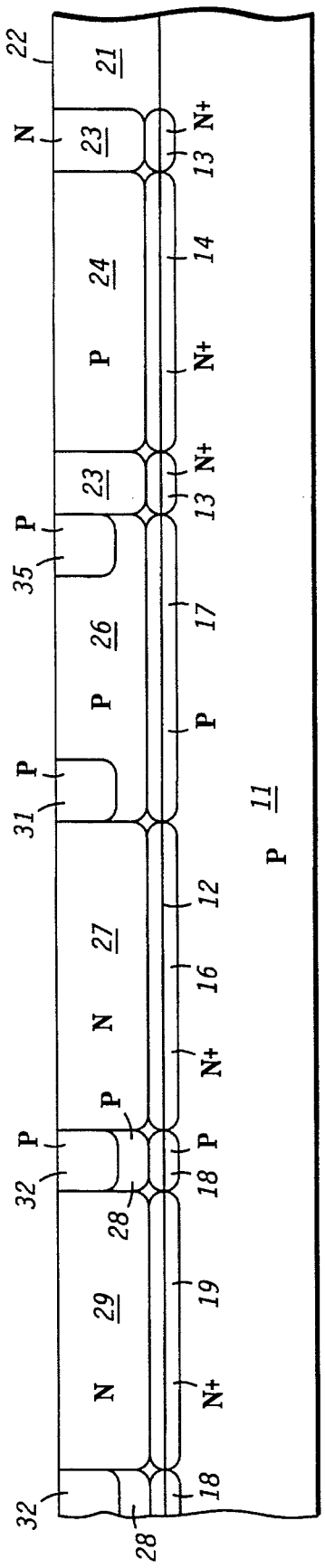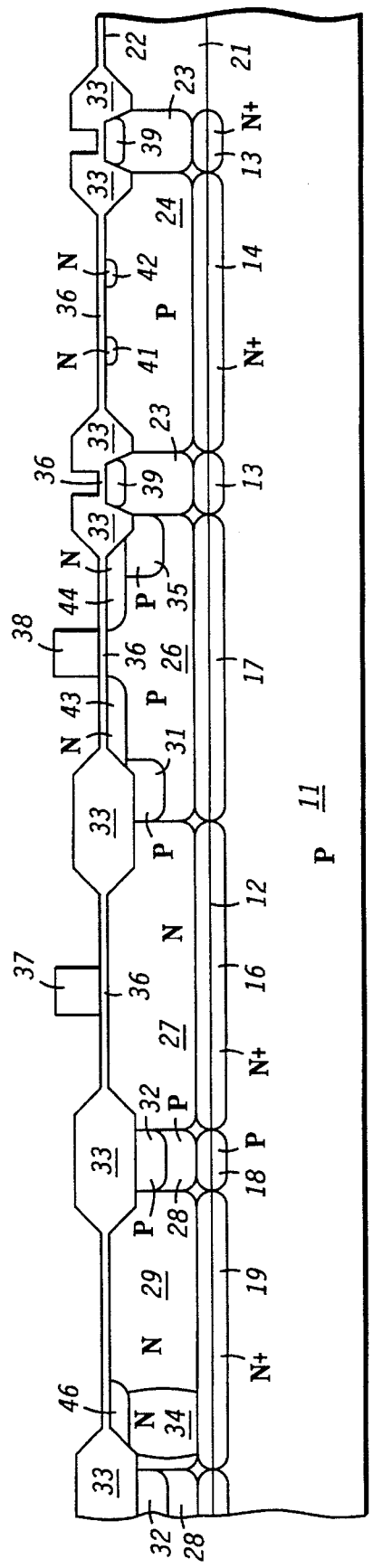
FIG. 1
FIG. 2

5,618,688

1

METHOD OF FORMING A MONOLITHIC SEMICONDUCTOR INTEGRATED CIRCUIT HAVING AN N-CHANNEL JFET

FIELD OF THE INVENTION

The present invention relates, in general, to junction field effect transistors, and more particularly, to a method of monolithically fabricating N-channel junction field effect transistors.

BACKGROUND OF THE INVENTION

BiCMOS (bipolar-complementary metal-oxide-semiconductor) circuits are used in digital circuit applications such as static random access memories (SRAM's) and gate arrays as well as in a variety of analog and digital circuit applications including communications, computer peripherals, disc drive controllers, etc. Typically, a bipolar portion of the BiCMOS circuit provides speed and current drive, while a CMOS (complementary metal-oxide-semiconductor) portion offers low power consumption and high yield. Although BiCMOS circuits offer the advantages of both bipolar and CMOS circuit technologies, they also suffer from some of the limitations of each type of circuit technology and from an increased process complexity required to monolithically fabricate different types of devices. For example, CMOS transistors have an unacceptable 1/f noise for linear circuit applications, whereas bipolar transistors consume large amounts of power.

Accordingly, it would be advantageous to have a monolithic integrated device manufactured in a BiCMOS process having a 1/f noise suitable for use in analog and radio-frequency (RF) circuit applications. It would be of further advantage for the monolithic integrated device to have a power consumption equivalent to that of CMOS circuitry and for the device to use electrons as the primary component of current flow. In addition, the process for manufacturing the semiconductor device should not substantially increase the complexity of the BICMOS process.

BRIEF DESCRIPTION OF THE DRAWINGS

FIGS. 1–4 illustrate enlarged cross-sectional views of a portion of a monolithically integrated N-channel junction field effect transistor, complementary insulated gate field effect transistors, and an NPN bipolar junction transistor during various stages of fabrication in accordance with an embodiment of the present invention.

DETAILED DESCRIPTION OF THE DRAWINGS

Figure 3:
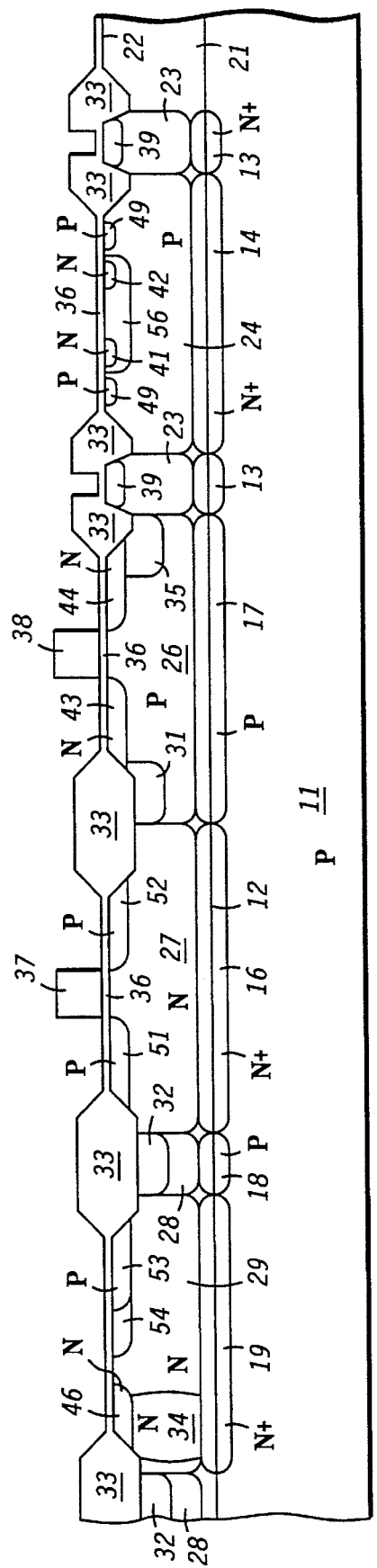

The present invention provides an N-channel junction field effect transistor (N-channel JFET) and a method of fabricating or forming the N-channel JFET. More particularly, the present invention provides a method of fabricating an isolated N-channel JFET, complementary insulated gate field effect transistors (complementary IGFET), and a bipolar junction transistor (BJT) as a monolithic semiconductor integrated circuit or device structure. In other words, the present invention comprises a method of fabricating the N-channel JFET in a BiCMOS (bipolar-complementary metal-oxide-semiconductor) process. For illustrative convenience, only an N-channel JFET, an N-channel IGFET, a P-channel IGFET, and an NPN BJT will be shown. However, combinations of N-channel JFET's, P-channel JFET's, N-channel IGFET's, P-channel IGFET's, NPN BJT's, PNP BJT's, resistors, capacitors, etc. may be fabricated in a single chip. It shall be understood that the terms BiCMOS and CMOS as used herein are intended to include complementary insulated gate field effect transistors and complementary metal-oxide-semiconductor transistors. It shall be further understood that the same reference numerals are used in the figures to denote the same elements.

FIG. 1 illustrates an enlarged cross-sectional view of a portion of a monolithic integrated semiconductor device 10 in a beginning stage of fabrication. What is shown is a semiconductor substrate 11 of P conductivity type having a principal surface 12. By way of example, semiconductor substrate 11 has a dopant concentration of approximately $1\times10^{15}$ atoms per cubic centimeter (atoms/cm³). An annular shaped N⁺ buried layer 13, an N⁺ buried layer 14, an N⁺ buried layer 16, a P buried layer 17, an annular shaped P buried layer 18, and an N⁺ buried layer 19 are formed in the semiconductor substrate 11. In one embodiment, N+ buried layers 13, 14, 16, and 19 are formed to have a peak concentration ranging between approximately $1\times10^{19}$ atoms/cm³ and approximately $8\times10^{19}$ atoms/cm³. In a preferred embodiment, buried layer 14 is less heavily doped than annular buried layer 13 and has a peak concentration ranging between approximately $1\times10^{18}$ atoms/cm³ and approximately $8\times10^{18}$ atoms/cm³. P buried layers 17 and 18 are formed to have a peak concentration ranging between approximately $1\times10^{17}$ atoms/cm³ and approximately $5\times10^{17}$ atoms/cm³.

An epitaxial layer 21 having a major surface 22 is formed on principal surface 12. Epitaxial layer 21 may have a thickness of less than approximately 2 micrometers (μm). By way of example, epitaxial layer 21 has a dopant concentration of less than approximately $5\times10^{15}$ atoms/cm³. Further, at this concentration the dopant may be of N or P conductivity type. Preferably, epitaxial layer 21 has a thickness ranging between approximately 1 μm and approximately 1.6 μm. Semiconductor substrate 11 having epitaxial layer 21 disposed thereon is also referred to as a semiconductor material having a major surface 22.

Subsequently, an annular shaped N-type well 23, a P-type well 24, a P-type well 26, an N-type well 27, an annular shaped P-type well 28, and an N-type well 29 are all formed in epitaxial layer 21. By way of example, the concentration of dopants forming N-type wells 23, 27, and 29 as well as the concentration of dopants forming P-type wells 24, 26, and 28 is between approximately $1\times10^{16}$ atoms/cm³ and approximately $1\times10^{17}$ atoms/cm³. P-type well 24 is aligned and in contact with N⁺ buried layer 14, P-type well 26 is aligned and in contact with P buried layer 17, N-type well 27 is aligned and in contact with N⁺ buried layer 16, and N-type well 29 is aligned and in contact with N⁺ buried layer 19. Next, P⁻-type field regions 31 and 35 are formed in P-type well 26, and an annular P-type field region 32 is formed in annular P-type well 28. Methods of forming buried layers 13, 14, and 16–19, epitaxial layer 21, wells 23, 24, and 26–29, and field regions 31, 32, and 35 are well known to those skilled in the art.

FIG. 2 illustrates the structure of FIG. 1 further along in the fabrication process. Field oxide regions 33 are formed on major surface 22 of epitaxial layer 21. Portions of field oxide regions 33, along with annular N-type field region 23 and buried layers 13 and 14, form an isolated N-channel JFET region 24, which is also referred to as an N-channel JFET active area. It shall be understood that isolated N-channel JFET region 24 is contiguous with buried layer 14. It shall be further understood that annular N-type well 23 and annular buried layer 13 serve as a lateral isolation means. Thus, the lateral isolation means is contiguous with major surface 22 and buried layer 14. As those skilled in the art are aware, the lateral isolation means is not limited to the combination of an annular N-type well 23 and an annular buried layer 13. Another suitable lateral isolation means is shown in U.S. Pat. No. 5,134,082 issued to Kirchgessner on Jul. 28, 1992 and assigned to Motorola, Inc. A suitable isolation scheme is shown in U.S. Pat. No. 5,268,312 issued to Reuss et al. on Dec. 7, 1993 and assigned to Motorola, Inc. U.S. Pat. No. 5,134,082 and U.S. Pat. No. 5,268,312 are hereby incorporated herein by reference.

A P-type well 26, along with P⁻-type field regions 31 and 35, form an N-channel IGFET region 26, which is also referred to as an N-channel IGFET active area. As those skilled in the art shall understand, N-channel IGFET region 26 is electrically isolated from regions 24, 27 and 29, but not from other N-channel IGFET regions 26 within epitaxial layer 21. Portions of field oxide regions 33, along with annular P-type field region 32, P-type well 28, buried layer 18 and semiconductor substrate 11 form isolated BJT region 29, which is also referred to as a BJT active area. Yet other portions of field oxide regions 33, along with P⁻-type field region 31 and annular P-type field region 32, P-type wells 26 and 28, buried layers 17 and 18, and substrate 11 form an isolated P-channel IGFET region 27, which is also referred to as a P-channel active area. A well known method of forming field oxide regions 33 is with the use of an oxide, buffer polysilicon, and silicon nitride mask (not shown), however other processes which are also well known in the art are also suitable.

An N-type dopant such as, for example, phosphorus is implanted to form an N⁺ deep collector region 34 in the isolated BJT region 29. Deep collector region 34 extends from major surface 22 to N⁺ buried layer 19 and reduces the series resistance of the collector contact to an active NPN transistor to be fabricated in isolated BJT region 29 by lowering the resistance between major surface 22 and N⁺ buried layer 19. Further, a deep collector region (not shown) may be placed within annular shaped N-type well 23 to provide better isolation than just having annular shaped N-type well 23. Formation of a deep collector region is described in U.S. Pat. No. 4,902,639 issued to Ford on Feb. 20, 1990 and assigned to Motorola, Inc., and which is hereby incorporated herein by reference.

Still referring to FIG. 2, a thin gate oxide layer 36 is grown on portions of major surface 22 not covered by field oxide 33. Preferably gate oxide layer 36 has a thickness ranging between approximately 100 angstroms and approximately 400 angstroms. Although not shown, a P-type dopant such as, for example, boron is implanted through major surface 22 into isolated N-channel JFET region 24, N-channel IGFET region 26, isolated P-channel IGFET region 27, and isolated BJT region 29. The P-type dopant serves as a threshold voltage adjust for an N-channel and P-channel IGFET's to be fabricated in IGFET regions 26 and 27, respectively. Although the P-type dopant is not detrimental to regions 24 and 29, it may be desirable to prevent the P-type dopant from entering regions 24 and 29 by forming an implant mask (not shown) over these regions. As those skilled in the art are aware, other masked implants may be included to improve the performance of the IGFET's, wherein these other masked implants do not affect the JFET or the NPN BJT.

A layer of polysilicon (not shown) is formed on thin gate oxide layer 36 and on field oxide 33. The layer of polysilicon is heavily doped with an N⁺ dopant, such as phosphorus or arsenic. The layer of polysilicon could also be deposited as a heavily doped N⁺ layer using in-situ doping techniques.

The layer of polysilicon is patterned using standard photolithography and etch processes to form polysilicon gate regions or structures 37 and 38 over isolated P-channel IGFET 27 and N-channel IGFET region 26, respectively.

A first N⁺ block mask (not shown) is formed on gate oxide layer 36, field oxide 33, and polysilicon gate structures 37 and 38. By way of example, the first N⁺ block mask is photoresist. Using conventional photolithographic techniques, the first N⁺ block mask is patterned to have a plurality of openings which expose portions of gate oxide layer 36. For example, two openings of the plurality of openings expose portions of gate oxide layer 36 above isolated N-channel JFET region 24, one opening of the plurality of openings exposes a portion of gate oxide layer 36 above isolated BJT region 29, and two openings of the plurality of openings expose portions of gate oxide layer 36 above N-channel IGFET region 26, wherein the exposed portions of gate oxide layer 36 are adjacent opposite sides of polysilicon gate structure 38.

An N-type dopant is implanted through the openings in the first N⁺ block mask and into regions 23, 24, 26, and 29 below the exposed portions of gate oxide layer 36. Accordingly, N-type source and drain regions 41 and 42, respectively, are formed in isolated N-channel JFET region 24 and N-type source and drain regions 43 and 44, respectively, are formed in N-channel IGFET region 26. Preferably, the dose and implant energies are selected to provide shallow junctions, i.e., junctions having depths less than or equal to approximately 0.2 μm. As those skilled in the art are aware, the source and drain regions for a JFET and an IGFET are interchangeable. Thus, regions 41 and 42 may serve as the drain and source regions, respectively, for isolated N-channel JFET region 24, and regions 43 and 44 may serve as the drain and source regions, respectively, for N-channel IGFET region 26. Simultaneously, a collector contact region 46 is formed in BJT region 29. Further, an annular N-type region 39 is formed in annular well 23.

FIG. 3 illustrates the structure of FIG. 2 further along in the fabrication process. The first N⁺ block mask (not shown) is removed and a first P⁺ block mask (not shown) is formed on gate oxide layer 36, field oxide 33, and polysilicon gate structures 37 and 38. By way of example, the first P⁺ block mask is photoresist. Using conventional photolithographic techniques, the first P⁺ block mask is patterned to have a plurality of openings which expose portions of gate oxide layer 36. More particularly, one opening of the plurality of openings exposes portions of gate oxide layer 36 above isolated N-channel JFET region 24, one of the plurality of openings exposes portions of gate oxide layer 36 above isolated BJT region 29, and two of the plurality of openings expose portions of gate oxide layer 36 above P-channel IGFET region 27, wherein the exposed portions of gate oxide layer 36 are adjacent opposite sides of polysilicon gate structure 38.

A P-type dopant is implanted through the openings in the first P⁺ block mask and into regions 24, 27, and 29 below the exposed portions of gate oxide layer 36. An annular shaped P-type bottom gate region 49 is formed in N-channel JFET region 24, wherein annular P-type bottom gate region 49 surrounds N-type source and drain regions 41 and 42, respectively, and serves as a first gate of the N-channel JFET 60 (shown in FIG. 4). P-type source and drain regions 51 and 52, respectively, are formed in P-channel IGFET region 27. Further, a base contact region 53 is formed in isolated BJT region 29. Preferably, a species, dose, and implant energy of the P-type dopant are selected to provide shallow junctions, i.e., junctions having depths less than or equal to approximately 0.3 µm. As those skilled in the art will appreciate, methods for optimizing the insulated gate field effect transistors such as, for example, formation of lightly doped drains and spacers can be incorporated into the process without affecting the N-channel JFET or the BJT.

The first P⁺ block mask (not shown) is removed and a second P⁺ block mask (not shown) is formed on gate oxide layer 36, field oxide 33, and polysilicon gate structures 37 and 38. By way of example, the second P⁺ block mask is photoresist. Using conventional photolithographic techniques, the second P⁺ block mask is patterned to expose a portion of gate oxide layer 36 above isolated BJT region 29. A P-type dopant is implanted through the opening in the second P⁺ block mask and into the isolated BJT region 29 below the exposed portions of gate oxide layer 36, thereby forming a P-type base region 54. As those skilled in the art will appreciate, the dose and energy of the P-type dopant is selected to optimize the NPN BJT. It shall be understood that the P-type base region 54 contains the base contact region 53.

The second P⁺ block mask (not shown) is removed and a second N⁺ block mask (not shown) is formed on gate oxide layer 36, field oxide layer 33, and polysilicon gate structures 37 and 38. Using conventional photolithographic techniques, the second N⁺ block mask is patterned to have an opening which exposes a portion of gate oxide layer 36 above isolated N-channel JFET region 24. An N-type dopant is implanted through the opening in the second N⁺ block mask and into the isolated N-channel JFET region 24 below the exposed portions of gate oxide layer 36, thereby forming an N-type JFET channel region 56. As those skilled in the art will appreciate, the dose and energy of the N-type dopant is selected to optimize the JFET. The N-type JFET channel region 56 contains the source and drain regions 41 and 42, respectively. The N-type JFET channel region 56 extends between approximately 0.3 µm and approximately 0.6 µm into region 24 from major surface 22.

Figure 4:
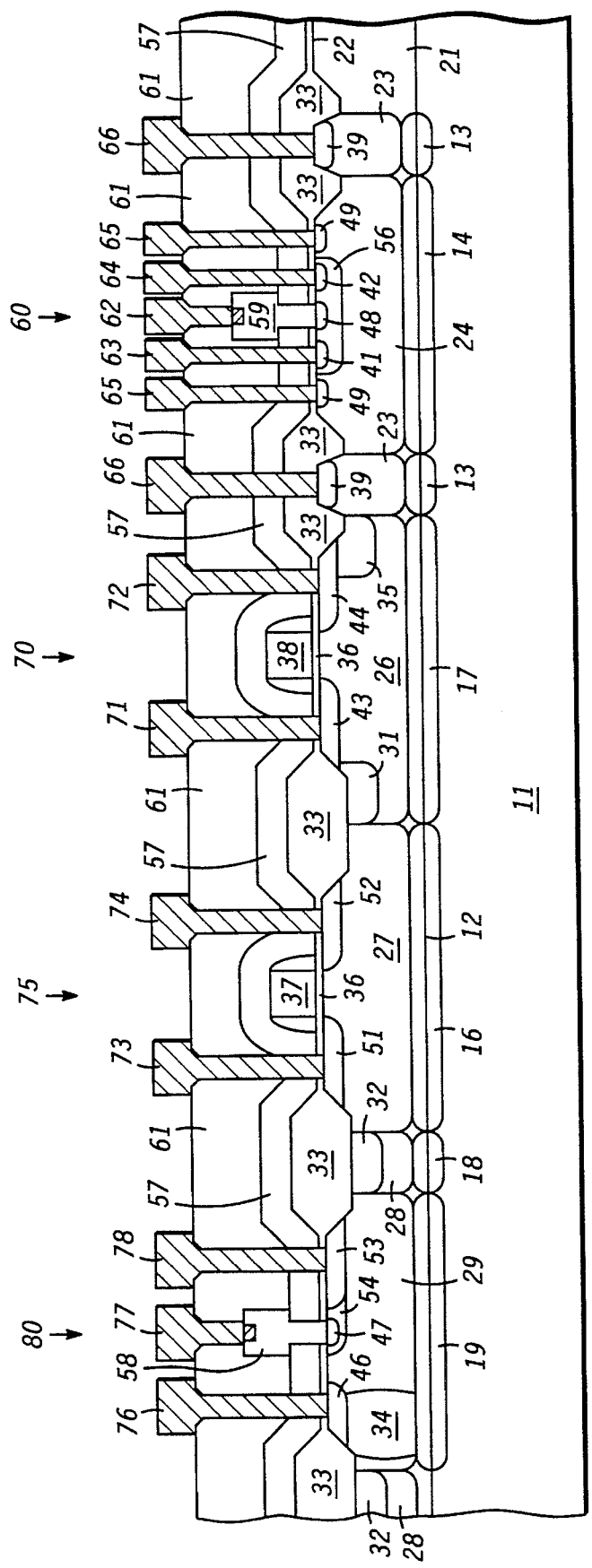

FIG. 4 illustrates the structure of FIG. 3 after further processing. A conformal layer of oxide layer 57 is formed on gate oxide layer 36, polysilicon gate structures 37 and 38, and on field oxide regions 33. Two openings (not shown) are formed in conformal layer of oxide 57 using techniques well known in the art. The first opening exposes emitter region 47 and the second opening exposes P-type top gate region 48. A conformal layer of polysilicon is formed on conformal layer of oxide 57 and fills the two openings. The conformal layer of polysilicon is patterned to form an emitter electrode 58 (for the NPN BJT) and a polysilicon gate electrode 59 (for the N-channel JFET) using techniques well known to those skilled in the art.

A third N⁺ block mask (not shown) of, for example, photoresist is formed over the exposed portions of oxide layer 57 and over polysilicon gate electrode 59. An N-type dopant is implanted into emitter electrode 58. The third N⁺ block mask is removed.

A third P⁺ block mask (not shown) of, for example, photoresist is formed over the exposed portions of oxide layer 57 and emitter electrode 58. A P-type dopant is implanted into polysilicon gate electrode 59 to form a P⁺ polysilicon gate electrode. The third P⁺ block mask is removed. An anneal is performed that out-diffuses the N-type dopant from the emitter electrode to form shallow active emitter region 47. By way of example shallow active emitter region 47 has a junction depth of less than approximately 0.1 µm. Accordingly, the emitter of NPN BJT 80 comprises a polysilicon emitter electrode 58 and an active emitter region 47. Further, the P-type dopant from the polysilicon gate electrode 59 out-diffuses into N-channel JFET isolation region 56 to form shallow active gate region 48. By way of example shallow active gate region 48, which serves as a second gate of the N-channel JFET 60 (shown in FIG. 4) has a junction depth of less than approximately 0.1 µm. Accordingly, one gate structure of N-channel JFET 60 comprises a polysilicon gate electrode 59 and an active gate region 48. Preferably polysilicon gate electrode 59 is positioned symmetrically between source region 41 and drain region 42. Formation of shallow junctions using a doped polysilicon diffusion source for enhanced device performance is well known in the art. By way of example, the dopant concentration for the N-type dopant implanted into emitter electrode 58 and for the P-type dopant implanted into polysilicon gate electrode 59 range between approximately $5 \times 10^{15}$ atoms/cm³ to approximately $1.5 \times 10^{16}$ atoms/cm³.

An oxide layer 61 is formed on oxide layer 57 and on both emitter electrode 58 and P⁺-polysilicon gate electrode 59. Optionally, oxide layer 61 may be planarized using techniques well known in the art. A plurality of contact openings (not shown) are formed in oxide layers 61 and 57, and in gate layer 36 which expose portions of N-channel JFET region 24, N-channel IGFET region 26, P-channel IGFET region 27, and BJT region 29. More particularly, openings in N-channel JFET region 24 expose portions of source region 41, drain region 42, P⁺-polysilicon gate 59, and P-type region 49; openings in N-channel IGFET region 26 expose portions of source region 43 and drain region 44; openings in P-channel IGFET region 27 expose portions of source region 51 and drain region 52; and openings in BJT region 29 expose portions of collector region 46, base contact region 53, and emitter electrode 58. In addition, isolation contact openings are formed to expose portions of annular N-type region 39.

A layer of contact metal (not shown) is conformally formed on oxide layer 61 and the plurality of contact openings in the N-channel JFET region 24, N-channel IGFET region 26, P-channel IGFET region 27, BJT region 29, and the isolation openings. Suitable contact metals include titanium and platinum. Subsequently, a barrier metal such as, for example, titanium nitride or titanium tungsten and a wiring metal such as, for example, aluminum silicon, aluminum copper, or aluminum copper silicon are deposited by methods well known in the art. The layer of contact metal, barrier metal, and wiring metal are patterned using standard photolithographic and etch techniques to form electrodes or contacts to the regions exposed by the plurality of contact openings. When the metal is titanium, titanium silicide contacts are formed and when the layer of metal is platinum, platinum silicide contacts are formed. Accordingly, an N-channel JFET 60 is formed in the N-channel JFET region, wherein the N-channel JFET has a source electrode 63, a drain electrode 64, a top gate electrode 62, and a bottom gate electrode 65. Although the bottom gate electrode 65 is an annular shaped electrode, it shall be understood that the bottom gate electrode may be on one side of the of N-channel region 56. An annular isolation electrode 66 contacts a portion of annular N-type region 39. A voltage is applied to annular isolation electrode 66 to reverse bias a PN junction between N-type well 23 and P-type well 24 (i.e., N-channel JFET region), thereby ensuring that N-channel JFET region 24 is electrically isolated from other circuit regions, i.e., N-channel IGFET region 26, P-channel IGFET region 27, BJT region 29.

An N-channel IGFET 70 is formed in N-channel IGFET region 26, wherein N-channel IGFET 70 has a source electrode 71, a drain electrode 72, and a gate electrode 38. A P-channel IGFET 75 is formed in P-channel IGFET region 27, wherein P-channel IGFET 75 has a source electrode 73, a drain electrode 74, and a gate electrode 37. An NPN BJT 80 is formed in BJT region 29, wherein NPN BJT 80 has a collector electrode 76, an emitter electrode 77, and a base electrode 78. Although not shown, it shall be understood that metal contacts are formed to gate electrode 38 of N-channel IGFET 70 and to gate electrode 37 of P-channel IGFET 75.

Although, the N-channel JFET 60 has been described as having a polysilicon gate electrode 59 and an NPN BJT 80 having a polysilicon emitter electrode 58, it shall be understood that the polysilicon gate can be replaced with a gate formed by doping a portion of the channel region 56 with an impurity material of P conductivity type such as was used for bottom gate 49. Further, the polysilicon emitter electrode 58 can be replaced with an emitter formed by doping a portion of the base region 54 of the NPN BJT active area 29 with an N-type impurity material such as was used in the formation of regions 41, 42, 43, 44, 46, and 39.

By now it should be appreciated that a monolithic semiconductor device comprising an N-channel junction field effect transistor, complementary insulated gate field effect transistors, and a bipolar junction transistor and a method of forming the monolithic semiconductor device has been provided. The present invention provides a method of fabricating an N-channel JFET in a BiCMOS process flow with little additional process complexity or cost. It is well known that JFET's offer a lower 1/f noise than both bipolar and insulated gate field effect transistors. Further, the method includes polysilicon electrodes which allow formation of high performance integrated NPN bipolar transistors and N-channel JFET's. More particularly, the use of a polysilicon gate electrode allows the N-channel JFET to be built in a thin epitaxial layer, thereby providing devices 60 with depths of less than approximately 1 μm. Also, because the N-channel JFET of the present invention is isolated from other semiconductor devices, it is ideally suited for radio-frequency (RF) applications. As a consequence, N-channel JFET's fabricated in accordance with the present invention have cut-off frequencies of at least 3 gigahertz and provide gain at 900 megahertz. Thus, N-channel JFET's of the present invention are ideal in oscillator applications.

Although the present invention has been described as forming an N-channel JFET in an isolation region, it shall be understood that the N-channel JFET may be formed in an unisolated region.

We claim:

1. A method of fabricating a monolithic semiconductor integrated circuit which comprises an N-channel junction field effect transistor, complementary insulated gate field effect transistors, and a bipolar junction transistor, the method comprising the steps of:

providing a semiconductor material of a first conductivity type and having a major surface;

forming an isolated N-channel junction field effect transistor region, an N-channel insulated gate field effect transistor region, an isolated P-channel insulated gate field effect transistor region, and an isolated bipolar junction transistor region in the semiconductor material, wherein the isolated N-channel junction field effect transistor region is contiguous with a buried layer of a second conductivity type;

forming a gate oxide layer on a portion of the major surface in the N-channel insulated gate field effect transistor region and on a portion of the major surface in the isolated P-channel insulated gate field effect transistor region;

forming a first gate conductor on the gate oxide on the portion of the major surface in the N-channel insulated gate field effect transistor region and a second gate conductor on the gate oxide on the portion of the major surface in the isolated P-channel insulated gate field effect transistor region;

forming a first source region and a first drain region in portions of the isolated N-channel junction field effect transistor region, a second source region and a second drain region in portions of the N-channel insulated gate field effect transistor region, and a collector contact region in a portion of the isolated bipolar junction transistor;

forming a third source region and a third drain region in portions of the isolated P-channel insulated gate field effect transistor region, and a gate contact region in a portion of the N-channel junction field effect transistor region;

forming a base region in another portion of the isolated bipolar junction transistor region;

forming a channel region in the N-channel junction field effect transistor region, wherein the channel region contains the first source region and the first drain region;

forming a polysilicon emitter in contact with a portion of the base region; and forming a polysilicon gate, wherein the polysilicon gate is in contact with a portion of the channel region between the first source region and the first drain region.

2. The method of claim 1, wherein the steps of forming a polysilicon emitter and forming a polysilicon gate further comprise:

doping the polysilicon emitter with an impurity material of the second conductivity type; and doping the polysilicon gate with an impurity material of the first conductivity type.

3. The method of claim 2, further including forming an active emitter region of the bipolar junction transistor by out-diffusing the impurity material from the polysilicon emitter into the base region.

4. The method of claim 2, further including forming an active gate region of the N-channel junction field effect transistor by out-diffusing the impurity material from the polysilicon gate into the channel region.

5. The method of claim 1, wherein the step of providing a semiconductor material comprises:

providing a semiconductor substrate of the first conductivity type having a principal surface;

forming at least one buried layer of the first conductivity type on the principal surface and at least one buried layer of the second conductivity type on the principal surface; and forming an epitaxial layer on the principal surface, wherein the epitaxial layer has a thickness less than approximately two micrometers and includes the major surface.

6. The method of claim 1, further including forming a contact to the polysilicon emitter, a contact to the polysilicon gate, a contact to a portion of the isolated N-channel junction field effect transistor region adjacent to and spaced apart from the channel region, an isolation contact to a portion of an isolation region surrounding the N-channel junction field effect transistor region, a first source contact to the first source region, a first drain contact to the first drain region, a second source contact to the second source region, a second drain contact to the second drain region, a third source contact to the third source region, a third drain contact to the third drain region, a collector contact to a collector contact region, and a base contact to the base region, wherein the first source and drain contacts are for an N-channel junction field effect transistor, the second source and drain contacts are for an N-channel insulated gate field effect transistor, the third source and drain contacts are for a P-channel insulated gate field effect transistor, and the collector contact and the base contact are for a bipolar junction transistor, wherein the contact comprises a material selected from the group consisting of titanium silicide and platinum silicide.

7. The method of claim 1, wherein lateral boundaries of the isolated N-channel junction field effect transistor region are formed from lateral isolation means extending from the major surface to the buried layer, the lateral isolation means being contiguous with the major surface and the buried layer.

8. The method of claim 1 further including selecting a material for the gate conductor from the group consisting of metal and polysilicon.

9. A method of fabricating a monolithic semiconductor structure which comprises an N-channel junction field effect transistor, an N-channel insulated gate field effect transistor, a P-channel insulated gate field effect transistor, and a bipolar junction transistor, comprising the steps of:

providing a semiconductor material of P conductivity type having an epitaxial layer disposed thereon, the epitaxial layer having a major surface and at least three isolated regions extending from the major surface into the epitaxial layer and a P-type well extending from the major surface into the epitaxial layer, wherein a first isolated region serves as an N-channel junction field effect transistor active area, a second isolated region serves as a P-channel insulated gate field effect transistor active area, a third isolated region serves as a bipolar junction transistor active area, and the P-type well serves as an N-channel insulated gate field effect transistor active area, and wherein the first isolated region is of P conductivity type and is bounded by a dopant layer of N conductivity type;

forming a first insulated gate structure on a portion of the major surface in the second isolated region and forming a second insulated gate structure on a portion of the major surface of the P-type well;

forming a first source region and a first drain region in the first isolated region, a second source region and a second drain region in the P-type well, and a first doped region in the third isolated region, wherein the first and second source regions, the first and second drain regions, and the first doped region are of N conductivity type;

forming a third source region and a third drain region in the second isolated region, a second doped region in the third isolated region, a first doped region in the first isolated region, wherein the third source region, the third drain region, the second doped region in the third isolated region and the first doped region in the first isolated region are of P conductivity type;

forming a base region in the third isolated region, wherein the base region is of P conductivity type and encloses the second doped region;

forming a channel region in the first isolated region, wherein the channel region is of N conductivity type, and encloses the first source region and the first drain region;

forming an emitter in the second doped region of the third isolated region; and forming a second doped region in the channel region, the second doped region between and spaced apart from the first source region and the first drain region, wherein the first and second doped regions serve as gates for the N-channel junction field effect transistor.

10. The method of claim 9 including forming the emitter as a doped polysilicon emitter, wherein a dopant of the doped polysilicon emitter out-diffuses into the second doped region in the third isolation region and the second doped region in the channel region comprises a polysilicon contact doped with a dopant that out-diffuses into the channel region.

11. The method of claim 10 further including forming the first doped region as an annular structure spaced apart from and laterally surrounding the channel region.

12. The method of claim 10, further including forming a silicide of one of platinum or titanium in a portion of the first source region, a portion of the first drain region, a portion of the second source region, a portion of the second drain region, a portion of the third source region, a portion of the third drain region, a portion of the a first doped region in the third isolation region, a portion of the a second doped region in the third isolation region, a portion of the doped polysilicon emitter, a portion of the first doped region in the first isolation region, and a portion of the second doped region in the channel region.

13. The method of claim 10, including implanting an impurity material of N conductivity type into a portion of the second doped region of the third isolation region to form an emitter;

doping a portion of the channel region with an impurity material of P conductivity type to form the second doped region, the portion of the channel region doped with the impurity material of P conductivity type being between and spaced apart from the first source region and the first drain region; and wherein the step of forming a first doped region in the first isolation region comprises doping a portion of the first isolation region with an impurity material of P conductivity type to form the first doped region adjacent to and spaced apart from the channel region.

* * * * *